US 6,545,482 B1

(12) United States Patent
Fedirchuk et al.

(10) Patent No.: US 6,545,482 B1
(45) Date of Patent: Apr. 8, 2003

(54) MONITORING WIDE AREA DYNAMIC SWING RECORDINGS ON AN ELECTRICAL POWER SYSTEM

(75) Inventors: David James Fedirchuk, Ille Des Chenes (CA); Michael David Miller, Winnipeg (CA)

(73) Assignee: NxtPhase Technology SRL, Holetown (BB)

( * ) Notice: Subject to any disclaimer, the term of this patent is extended or adjusted under 35 U.S.C. 154(b) by 0 days.

(21) Appl. No.: 09/667,582

(22) Filed: Sep. 22, 2000

(51) Int. Cl.$^7$ .............................................. G01R 31/08
(52) U.S. Cl. ........................................ 324/522; 702/57
(58) Field of Search .................... 324/72, 96, 113–115, 324/127, 522; 340/870, 660–661, 310; 361/64, 66, 68, 79; 700/286; 713/300; 702/57, 62, 64, 185

(56) References Cited

U.S. PATENT DOCUMENTS 4,644,320 A * 2/1987 Carr et al. ................... 340/310
6,360,177 B1 * 3/2002 Curt et al. ..................... 702/64

OTHER PUBLICATIONS

APT Power Technologies, TESLA Specification, 11 pages-(Front page and pp. 1–10). http://www.nxtphase.com/pdfs/TESLA_Distrubance_Recorder_Specifications.pdf.*

APT Power Technologies, RecordBase Central Station Brochure, 1 page. http://www.nxtphase.com/sub-products-apt_relays-recordbase.htm.*

* cited by examiner

Primary Examiner—Christine Oda
Assistant Examiner—Amy He
(74) Attorney, Agent, or Firm—Adrian D. Battison; Michael R. Williams; Ryan W. Dupuis

(57) ABSTRACT

A monitoring system for an electrical power transmission network or grid provides a recording network that can capture data on the response of the electrical power system over a wide geographical area to de-stabilizing electrical events. The captured data is obtained from multiple recording locations provided by individual recording units storing data on voltage and current on respective power transmission lines of the network. When an event is detected by one of the units, the central station interrogates the other units to obtain data based upon the same time as determined by a GPS clock at each unit and is thus automatically time-synchronized so that an overall coordinated snapshot of the power system dynamics is achieved. The wide-area capture is achieved through standard non-dedicated Internet, Intranet, and/or switched telephone network communication links.

11 Claims, 2 Drawing Sheets

MONITORING WIDE AREA DYNAMIC SWING RECORDINGS ON AN ELECTRICAL POWER SYSTEM

This invention relates to a method for monitoring de-stabilizing electrical events in an electrical power grid including a plurality of power lines interconnected to form the grid and to a monitoring unit for use in the method.

BACKGROUND OF THE INVENTION

Equipment for monitoring the operation of an electrical power grid has been available for many years. The electrical power grid includes a plurality of electrical power transmission lines which are interconnected to supply power from a plurality of power sources to a plurality of power users. The grid interconnects power from a number of different sources to protect against blackouts due to individual failures. The grid includes transmission lines which accommodate different routings of the power again to avoid blackout due to damage to or failure of individual power transmission lines or transmission components.

Computer models of the grid or network are used to predict the response of the complete grid or network to individual failures or events. Great care is taken to attempt to avoid extensive or catastrophic failure leading to a wide reaching blackout. However such events do occur and are triggered by individual failures which then escalate if remedial action is not taken in good time.

Monitoring units are available for monitoring the individual power transmission lines. Such a unit is available from APT Power Technologies of Winnipeg, Manitoba, Canada under the trademark "TESLA" and a description of this intelligent electronic device is well known to one skilled in the art.

This monitoring unit includes conventional transducers which are responsive to the voltage and current on the transmission line and provide an input to a processor of the monitoring unit for storage in a memory. Communication of data from the monitoring unit to a central recording station can be effected.

The individual monitoring units include algorithms which allow detection and recording of dynamic events that are evident at the point on the power grid to which the unit is connected.

However these individual monitoring units do not provide a system which allows the managers of the network to determine the effect of events over a wide range of the network.

SUMMARY OF THE INVENTION

It is one object of the present invention therefore to provide an improvement to a conventional monitoring system which allows the response of the wide area of the grid to a de-stabilizing event to be monitored.

According to one aspect of the invention there is provided a method for monitoring de-stabilizing electrical events in an electrical power grid including a plurality of power lines interconnected to form the grid comprising:

providing a plurality of independent monitoring units located at separate locations in the electrical power grid;

each unit having inputs for receiving signals related to sampled values of voltage and current on a respective one of the power lines of the grid;

each unit having a clock input indicative of a current time;

each unit having a memory for storing data over a period of time related to the sampled values of voltage and current on the respective power line in association with the current time, as the values vary during the time period;

providing in each unit a processor responsive to the input signals and configured to recognise a de-stabilizing electrical event;

providing a central station arranged for communication to and from each of the units over a communication medium;

when a de-stabilizing electrical event is recognized by one of the units at an event time, causing that unit to communicate to the central station the event time and a trigger command;

when the central station receives the event time and the trigger command, causing the central station to communicate over the communication medium to each of the units the trigger command and the event time;

the trigger command at each unit causing a record to be created and stored on the unit of the data at the event time;

and causing the central station to collate the data for the event time from each of the units in its own database.

Preferably the communication medium is non-dedicated and can be provided by conventional phone lines using a data modem for communication of the data, or may be provided by the internet, satellite communication or other suitable medium.

Preferably the method includes providing at least one additional separate central station each having associated therewith a plurality of units and arranging the central stations such that when one central station receives the event time and the data, is caused to communicate over the communication medium to the additional central station for communication to each of the units associated with the additional central station a the trigger command and the event time.

Preferably the clock input is obtained from GPS.

Preferably the memory of each unit is a continuous circular memory arranged to store data over a time of the order of ten to thirty minutes.

According to a second aspect of the invention there is provided a monitoring unit for monitoring de-stabilizing electrical events in an electrical power grid including a plurality of power lines interconnected to form the grid comprising:

a monitoring processor arranged to be located at a respective one of a plurality of separate locations in the electrical power grid;

inputs for receiving signals related to sampled values of voltage and current on a respective one of the power lines of the grid;

a clock input for providing a signal indicative of a current time;

a memory for storing data over a period of time related to the sampled values of voltage and current on the respective power line in association with the current time as the values vary during the time period;

an output arranged for communication to and from a central station over a communication medium;

the processor being arranged to be responsive to the input signals for recognizing a de-stabilizing electrical event and, when a de-stabilizing electrical event is recognized by the unit at an event time, to communicate via the output to the central station the event time and a trigger command;

and the processor being arranged, when receiving via the output from the central station a trigger command and an event time, to store in the memory of the unit data in association with that event time.

The invention as defined above therefore provides a recording system that can capture data on the response of an electrical power system over a wide geographical area to de-stabilizing electrical events and ensures recordings from all recording points at the time of the event by issuing cross-triggers via the central station. The captured data can be obtained from multiple recording locations and is automatically time-synchronized so that an overall coordinated snapshot of the power system dynamics is achieved. The wide-area capture is achieved through standard Internet, Intranet, and/or switched telephone network communication links.

BRIEF DESCRIPTION OF THE DRAWINGS

One embodiment of the invention will now be described in conjunction with the accompanying drawings in which.

DETAILED DESCRIPTION OF PREFERRED EMBODIMENTS

Figure 1:
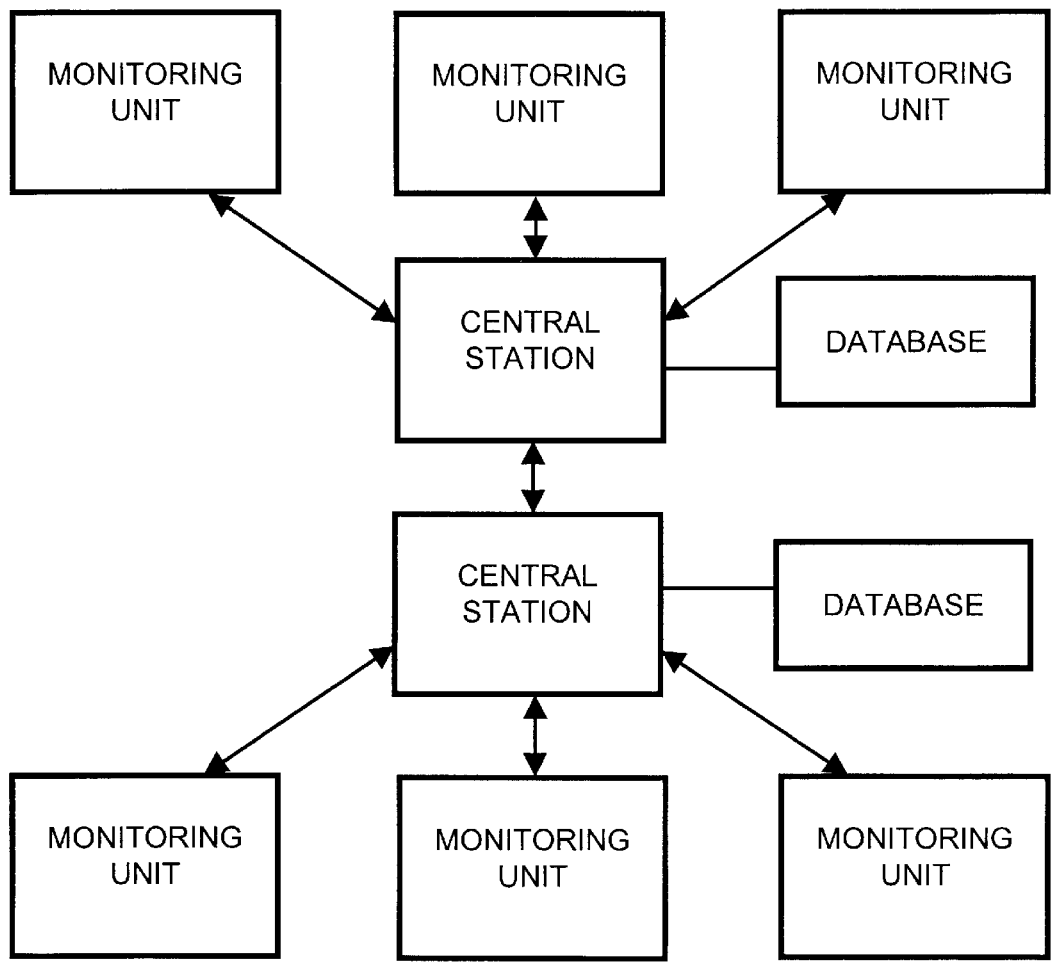
FIG. 1 is an illustration of the monitoring system according to the present invention including a plurality of separate monitoring units.

The recording system shown in FIG. 1 consists of a number of monitoring units 10 and a central station 11. The monitoring units are located in electrical power substations and are connected to transducers 12 that provide electrical signals that correspond to the voltage and current on the power lines. The monitoring units maintain a continuous, circular, 20 minute history of voltage and current readings in a memory 13. Each monitoring unit obtains accurate time information from an attached GPS clock 14 and associates this time to the captured voltages and currents.

In the embodiment shown there are two sets of the monitoring units each set associated with a respective central station. The central stations are typically located in the utility's control centers. They provide automated data collection from the recorders and maintain a database of information used for system analysis.

Communication between a central station and its monitoring units is via modem over switched telephone system or through a dedicated network connection.

Communication between the central stations is via modem over switched telephone system or through an Internet connection.

Figure 2:
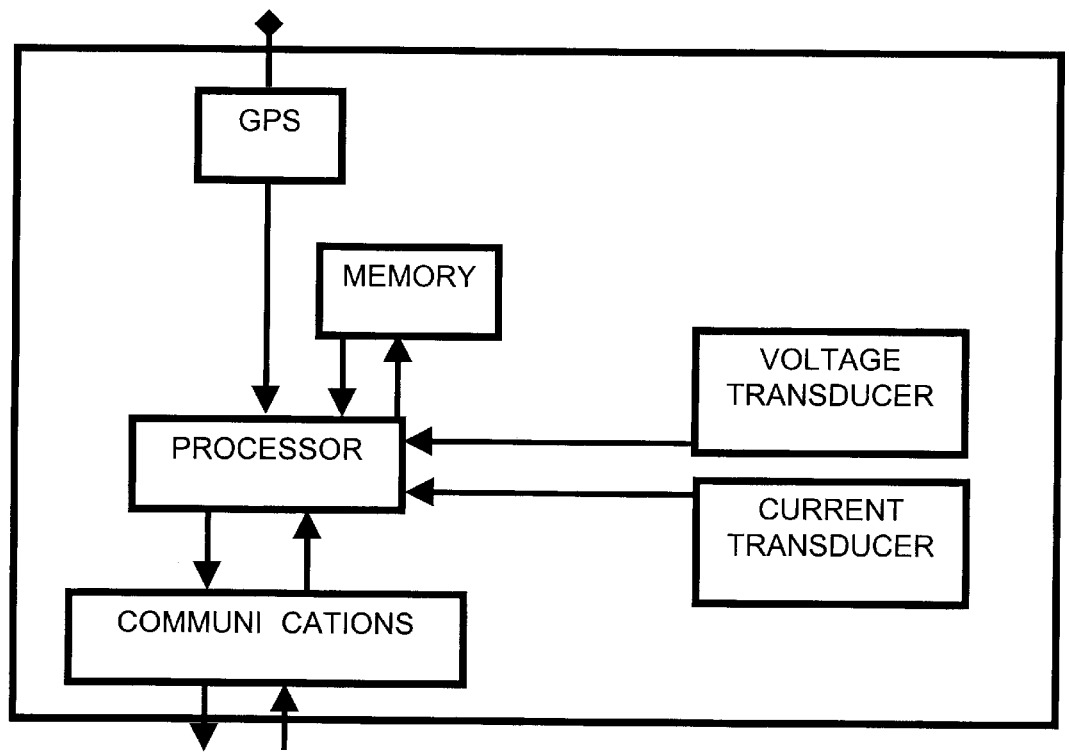
FIG. 2 is an illustration of one of the monitoring units.

Each monitoring unit shown in FIG. 2 continuously obtains voltage and current data from the power system, converts it to digital form and runs processing algorithms to detect disturbances in the power system. When a disturbance is detected that meets the recorder's configured requirements, the recorder establishes a communication link with its central station and reports the trigger condition, along with the precise time of the trigger (timestamp). The recorder then initiates capture of the data into a record file and stores the file in memory.

Upon receiving the trigger report from one of its monitoring units, the central station communicates with other monitoring units and central stations issuing a cross-trigger command with the original trigger timestamp, that is the time of the event. All triggered central stations then establish communication with each of their monitoring units configured for inclusion in cross-trigger events and issue the cross-trigger commands with the original trigger timestamp. In response to the trigger command, each monitoring unit extracts data from its history buffer based on the specified trigger time.

Each central station then transfers the resultant records from the recorders into its central database, where they are available for analysis.

Details of the basic arrangement of the monitoring unit are available from the above document describing the APT device and from such devices available in the field.

The voltage and current transducers together with a typical algorithm for detecting an event of the type which is transmitted to the central station are well known to one skilled in the art and therefore do not need to be described in detail herein.

In case of failure or in the absence of an external clock (e.g. GPS) the system will revert to using its internal clock. It should be further noted that when there is an external clock source the systems' internal clock is continuously synchronized to it to ensure highest level of accuracy for situations when the external clock fails or is removed.

Since various modifications can be made in the invention as herein above described, and many apparently widely different embodiments of same made within the spirit and scope of the claims without department from such spirit and scope, it is intended that all matter contained in the accompanying specification shall be interpreted as illustrative only and not in a limiting sense.

What is claimed is:

1. A method for monitoring de-stabilizing electrical events in an electrical power grid including a plurality of power lines interconnected to form the grid comprising:

providing a plurality of independent monitoring units located at separate locations in the electrical power grid;

each unit having inputs for receiving signals related to sampled values of voltage and current on a respective one of the power lines of the grid;

each unit having a clock input indicative of a current time;

each unit having a memory for storing data over a period of time related to the sampled values of voltage and current on the respective power line in association with the current time, as the values vary during the time period;

providing in each unit a processor responsive to the input signals and configured to recognise a de-stabilizing electrical event;

providing a central station arranged for communication to and from each of the units over a communication medium;

when a de-stabilizing electrical event is recognized by one of the units at an event time, causing that unit to communicate to the central station the event time and a trigger command;

when the central station receives the event time and the trigger command, causing the central station to communicate over the communication medium to each of the units the trigger command and the event time;

the trigger command at each unit causing a record to be created and stored on the unit of the data at the event time;

and causing the central station to collate the data for the event time from each of the units in its own database.

2. The method according to claim 1 wherein the communication medium is non-dedicated.

3. The method according to claim 1 wherein the memory of each unit is a continuous circular memory arranged to store data over a time of the order of ten to thirty minutes.

4. A method for monitoring de-stabilizing electrical events in an electrical power grid including a plurality of power lines interconnected to form the grid comprising:

providing a plurality of independent monitoring units located at separate locations in the electrical power grid;

each unit having inputs for receiving signals related to sampled values of voltage and current on a respective one of the power lines of the grid;

each unit having a clock input indicative of a current time;

each unit having a memory for storing data over a period of time related to the sampled values of voltage and current on the respective power line in association with the current time, as the values vary during the time period;

providing in each unit a processor responsive to the input signals and configured to recognise a de-stabilizing electrical event;

providing a central station arranged for communication to and from each of the units over a communication medium;

when a de-stabilizing electrical event is recognized by one of the units at an event time, causing that unit to communicate to the central station the event time and a trigger command;

when the central station receives the event time and the trigger command, causing the central station to communicate over the communication medium to each of the units the trigger command and the event time;

the trigger command at each unit causing a record to be created and stored on the unit of the data at the event time;

and causing the central station to collate the data for the event time from each of the units in its own database;

providing at least one additional separate central station each having associated therewith a plurality of units and arranging the central stations such that, when one central station receives the event time and the data, said one central station is caused to communicate over the communication medium to the other central station for communication to each of the units associated with the other central station a the trigger command and the event time.

5. The method according to claim 4 wherein the clock input is obtained from GPS.

6. The method according to claim 4 wherein the memory of each unit is a continuous circular memory arranged to store data over a time of the order of ten to thirty minutes.

7. A method for monitoring de-stabilizing electrical events in an electrical power grid including a plurality of power lines interconnected to form the grid comprising:

providing a plurality of independent monitoring units located at separate locations in the electrical power grid;

each unit having inputs for receiving signals related to sampled values of voltage and current on a respective one of the power lines of the grid;

each unit having a clock input indicative of a current time;

each unit having a memory for storing data over a period of time related to the sampled values of voltage and current on the respective power line in association with the current time, as the values vary during the time period;

providing in each unit a processor responsive to the input signals and configured to recognise a de-stabilizing electrical event;

providing a central station arranged for communication to and from each of the units over a communication medium;

when a destabilizing electrical event is recognized by one of the units at an event time, causing that unit to communicate to the central station the event time and a trigger command;

when the central station receives the event time and the trigger command, causing the central station to communicate over the communication medium to each of the units the trigger command and the event time;

the trigger command at each unit causing a record to be created and stored on the unit of the data at the event time;

and causing the central station to collate the data for the event time from each of the units in its own database;

wherein the clock input is obtained from GPS.

8. The method according to claim 7 wherein the memory of each unit is a continuous circular memory arranged to store data over a time of the order of ten to thirty minutes.

9. A monitoring unit for monitoring de-stabilizing electrical events in an electrical power grid including a plurality of power lines interconnected to form the grid comprising:

a monitoring processor arranged to be located at a respective one of a plurality of separate locations in the electrical power grid;

inputs for receiving signals related to instantaneous values of voltage and current on a respective one of the power lines of the grid;

a clock input for providing a signal indicative of a current time;

a memory for storing data over a period of time related to the sampled values of voltage and current on the respective power line in association with the current time as the values vary during the time period;

an output arranged for communication to and from a central station over a communication medium;

the processor being arranged to be responsive to the input signals for recognizing a de-stabilizing electrical event and, when a de-stabilizing electrical event is recognized by the unit at an event time, to communicate via the output to the central station the event time and a trigger command;

and the processor being arranged, when receiving via the output from the central station a trigger command and an event time, to store in the memory of the unit data in association with that event time.

10. The monitoring unit according to claim 9 wherein the clock input is obtained from GPS.

11. The monitoring unit according to claim 9 wherein the memory is a continuous circular memory arranged to store data over a time of the order of ten to thirty minutes.

* * * * *